United States Patent [19]
Horng et al.

[11] Patent Number: 5,858,182
[45] Date of Patent: Jan. 12, 1999

[54] BILAYER CARBON OVERCOATING FOR MAGNETIC DATA STORAGE DISKS AND MAGNETIC HEAD/SLIDER CONSTRUCTIONS

[75] Inventors: Cheng Tzong Horng, San Jose; Jei-Wei Chang, Cupertino, both of Calif.

[73] Assignee: Headway Technoloies, Inc., Milpitas, Calif.

[21] Appl. No.: 822,248

[22] Filed: Mar. 20, 1997

[51] Int. Cl.$^6$ .................................................. C23C 14/34
[52] U.S. Cl. .............................. 204/192.16; 204/192.15; 204/192.2; 427/122; 427/128; 427/131; 427/599; 427/577
[58] Field of Search .......................... 204/192.15, 192.2, 204/192.16; 427/122, 128, 131, 599, 577

[56] References Cited

U.S. PATENT DOCUMENTS

| | | | |
|---|---|---|---|
| 4,503,125 | 3/1985 | Nelson et al. | 428/408 |
| 4,861,662 | 8/1989 | Kobliska et al. | 428/408 |
| 5,045,165 | 9/1991 | Yamashita | 204/192.16 |
| 5,104,709 | 4/1992 | Kokaku et al. | 428/694 |
| 5,110,676 | 5/1992 | Murai et al. | 428/336 |
| 5,159,508 | 10/1992 | Grill et al. | 360/103 |
| 5,453,168 | 9/1995 | Nelson et al. | 204/192.16 |
| 5,567,512 | 10/1996 | Chen et al. | 428/332 |
| 5,569,506 | 10/1996 | Johnes et al. | 428/65.3 |
| 5,785,825 | 7/1998 | Hwang et al. | 204/192.16 |

OTHER PUBLICATIONS

Lee et al, "The Effect of Chemical and Surface Properties of Hydrogenated Performance of Rigid Magnetic Disks" Carbonovercoats on the Tribological IEEE Trans on Magnitics, vol. 29(1), Jan. 1993 pp. 276–281.

Bagg et al "Enhancement of Head–Disk Interface Durability by use of Diamond Digest of the Magnetic Recording Like Carbon on Overcoats on the Sliders Rails" Digest of the Magnetic Recording Conf. Sep. 1993, DS.

Wong et al, "Tribological & Recording Performance of Carbon Coated thin film Head Unlubricated and Lubricated Thin Film Media," IEEE Trans Sliderson on Magnetics, vol. 30(6), Nov. 1994, pp. 4125–4127.

Wong et al. "the Effect of Hydrogen in Carbon Overcoats on the Tribology of the Head–DiskInterface" IEEE Trans on Magnetics, vol. 31(6), Nov. 1995, pp. 2919–2921.

"The Interaction of Lubricant with Hydrogenated Carbon-"Digest of Intermag '96 Conference, Jul. 1996. HA–07.

*Primary Examiner*—Nam Nguyen
*Assistant Examiner*—Steven H. VerSteeg
*Attorney, Agent, or Firm*—George O. Saile; Stephen B. Ackerman; Alek P. Szecsy

[57] ABSTRACT

A magnetic head/slider construction and a magnetic data recording disk, as well as a method for fabricating the magnetic head/slider construction and the magnetic data storage disk. To practice the method, there is formed over the air bearing surface of each of a magnetic head/slider construction and a magnetic data storage disk a wear resistant carbon layer. Over each of the wear resistant carbon layers is then formed a lubricating carbon layer. The lubricating carbon layers may be formed in-situ upon the wear resistant carbon layers. The wear resistant carbon layers may be formed from nitrogenated wear resistant carbon materials having a nitrogen content of from about 15 to about 30 atomic percent and hydrogenated wear resistant carbon materials having a hydrogen content of from about 15 to about 25 atomic percent. The lubricating carbon layer is preferably formed from a hydrogenated lubricating carbon material having a hydrogen content of from about 30 to about 40 atomic percent. Through the method, there is formed magnetic head/slider constructions and magnetic data recording disks simultaneously possessing improved wear resistance characteristics and improved lubricating properties.

12 Claims, 2 Drawing Sheets

BILAYER CARBON OVERCOATING FOR MAGNETIC DATA STORAGE DISKS AND MAGNETIC HEAD/SLIDER CONSTRUCTIONS

BACKGROUND OF THE INVENTION

1. Field of the Invention

The present invention relates generally to overcoatings for magnetic data storage disks and magnetic head/slider constructions. More particularly, the present invention relates to wear resistant and lubricating overcoatings for magnetic data storage disks and magnetic head/slider constructions.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

In that regard, the storage density of direct access storage devices (DASDs) employed in digitally encoded magnetic data storage and retrieval is typically determined, at least in part, by a separation distance of a magnetic head/slider construction from a rotating magnetic data storage disk into which rotating magnetic data storage disk digitally encoded magnetic data is written and from which rotating magnetic data storage disk digitally encoded magnetic data is read. Similarly, the reliability of direct access storage devices (DASDs) employed in digitally encoded magnetic data storage and retrieval is also in part determined by the ability to maintain a close, uniform and asperity free separation distance of the magnetic head/slider construction from the rotating magnetic data storage disk. In addition, however, the reliability of direct access storage devices (DASDs) employed in digitally encoded magnetic data storage and retrieval is also in part determined by the wear and tribologic characteristics of: (1) a static magnetic head/slider construction resting upon a static magnetic data storage disk; (2) an accelerating magnetic head/slider construction taking off from an accelerating magnetic data storage disk; and (3) a decelerating magnetic head/slider construction landing upon a decelerating magnetic data storage disk, since the foregoing static, accelerating and decelerating conditions are at least occasionally encountered within all installations of direct access storage devices (DASDs) and are routinely encountered within direct access storage device (DASD) installations which are operated transiently.

Towards the goal of improving reliability of direct access storage devices (DASDs) through providing optimal wear and tribologic characteristics of magnetic head/slider constructions with respect to magnetic data storage disks within those direct access storage devices (DASDs), it is known in the art of direct access storage device (DASD) fabrication to overcoat the air bearing surface(s) of at least either a magnetic head/slider construction or a magnetic data storage disk with a coating which either imparts improved wear characteristics to the magnetic head/slider construction and/or the magnetic data storage disk or imparts improved tribologic properties to the magnetic head/slider construction with respect to the magnetic data storage disk.

Several disclosures may be found in the pertinent arts pertaining to improvement of either the wear characteristics or the tribologic properties of magnetic head/slider constructions or magnetic data storage disks through overcoating those magnetic head/slider constructions or magnetic data storage disks with various overcoating compositions.

For example, Grill et al., in U.S. Pat. No. 5,159,508 disclose a magnetic head/slider construction having a wear resistant protective coating formed thereon, the wear resistant protective coating being formed from a thin adhesion layer formed upon the magnetic head/slider construction and a thin amorphous hydrogenated carbon layer formed upon the thin adhesion layer. The wear resistant protective coating may be employed both when fabricating the magnetic head/slider construction and when employing the magnetic head/slider construction within a direct access storage device (DASD) magnetic data storage enclosure.

In addition, Lee et al., in "The Effect of Chemical and Surface Properties of Hydrogenated Carbon Overcoats on the Tribological Performance of Rigid Magnetic Disks," IEEE Trans. on Magnetics, Vol. 29 (1), January 1993, pp. 276–81, disclose the effects of hydrogen content in the range of about 16 atomic percent to about 53 atomic percent within hydrogenated carbon overcoatings on tribologic properties of magnetic data storage disks overcoated with those hydrogenated carbon overcoatings. At the higher levels of hydrogen content disclosed, there was observed improved tribologic properties of the magnetic data storage disks as determined by magnetic head slider drag testing.

Further, Bogy et al., in "Enhancement of Head-Disk Interface Durability by Use of Diamond Like Carbon on Overcoats on the Slider's Rails," Digests of the Magnetic Recording Conference, September 1993, D5, disclose that diamond like carbon coatings when coated onto slider rails of sliders provide sliders with wear durability increase factors of from 50 to 200. The wear durability increases were obtained, however, with a concomitant increase in friction of the sliders with respect to thin film magnetic data storage disks.

Yet further, Wang et al., in "Tribological and Recording Performance of Carbon-Coated Thin Film Head Sliders on Unlubricated and Lubricated Thin Film Media," IEEE Trans. on Magnetic, Vol. 30 (6), November 1994, pp. 4125–27, disclose and compare the use of facing target sputtering (FTS) methods and DC magnetron sputtering methods for forming diamond like carbon coatings on thin film magnetic head/slider constructions. While diamond like carbon coatings formed through facing target sputtering (FTS) methods provide diamond like carbon coatings which are generally tribologically superior to diamond like carbon coatings formed through DC magnetron sputtering methods, thin film head/slider constructions having formed thereupon diamond like carbon coatings formed through either facing target sputtering (FTS) methods or DC magnetron sputtering methods provide tribologically superior thin film magnetic head/slider constructions in comparison with thin film magnetic head/slider constructions having no diamond like carbon coating formed thereupon.

Still yet further, Wang et al., in: (1) "The Effect of Hydrogen in Carbon Overcoats on the Tribology of the Head-Disk Interface," IEEE Trans. on Magnetics, Vol. 31 (6), November 1995, pp. 2919–21; and (2) "The Interaction of Lubricant With Hydrogenated Carbon," Digests of Intermag '96 Conference, July 1996, HA-07 disclose results of experiments employing contact stop/start (CSS) testing of hydrogenated carbon coated magnetic data storage disks overcoated with perfluoropolyether lubricant compositions, as a function of hydrogen content within the hydrogenated carbon coatings. It was observed that higher levels of hydrogen within the hydrogenated carbon coatings provided improved perfluoropolyether lubricant composition mobility over the magnetic data storage disks.

Yet still further, Chen et al., in U.S. Pat. No. 5,567,512 disclose a thin film magnetic data storage disk having formed thereupon a nitrogenated carbon coating, as well as a method for fabricating the nitrogenated carbon coating upon the thin film magnetic data storage disk. The nitrogenated carbon coating so formed imparts superior wear resistance to the magnetic data storage disk.

Finally, Jahnes et al., in U.S. Pat. No. 5,569,506 disclose: (1) a magnetic data storage disk having a textured surface which provides a magnetic data storage disk exhibiting a low level of static friction with respect to a magnetic head/slider construction positioned upon the magnetic data storage disk; and (2) a method for fabricating the magnetic data storage disk having the textured surface. Within the method for forming the magnetic data storage disk, there is employed a discontinuous textured interlayer formed between a pair of conformal amorphous carbon layers formed over the magnetic data storage disk.

As may be determined through analysis of the foregoing references, it is common within magnetic head/slider construction fabrication and magnetic data storage disk fabrication to employ overcoatings which impart to magnetic head/slider constructions or magnetic data storage disks either wear resistance characteristics or lubricating properties, but typically not simultaneously both wear resistance characteristics and lubricating properties.

It is thus in general towards the goal of forming form use within direct access storage devices (DASDs) magnetic head/slider constructions and magnetic data storage disks which have formed thereupon overcoatings which simultaneously provide to those magnetic head/slider constructions and magnetic data storage disks both improved wear resistance characteristics and improved lubricating properties that the present invention is generally directed. More particularly, the present invention is also directed more specifically towards the goal of forming with minimal process complexity for use within direct access storage devices (DASDs) magnetic head/slider constructions and magnetic data storage disks which have formed thereupon overcoatings which simultaneously provide both improved wear resistance characteristics and improved lubricating properties to those magnetic head/slider constructions and magnetic data storage disks.

SUMMARY OF THE INVENTION

A first object of the present invention is to provide a magnetic head/slider construction and a method for fabricating the magnetic head/slider construction, which magnetic head/slider construction simultaneously possesses improved wear resistance characteristics and improved lubricating properties.

A second object of the present invention is to provide a magnetic data storage disk and a method for fabricating the magnetic data storage disk, which magnetic data storage disk simultaneously possesses improved wear resistance characteristics and improved lubricating properties.

A third object of the present invention is to provide a magnetic head/slider construction or method in accord with the first object of the present invention, or a magnetic data storage disk or method in accord with the second object of the present invention, where the magnetic head/slider construction or the magnetic data storage disk is efficiently fabricated.

A fourth object of the present invention is to provide a magnetic head/slider construction or method in accord with the third object of the present invention, or a magnetic data storage disk or method in accord with the third object of the present invention, which magnetic head/slider construction, magnetic data storage disk or its associated method is readily manufacturable.

In accord with the objects of the present invention, there is provided by the present invention: (1) a wear resistant and lubricating magnetic head/slider construction; (2) a method for fabricating the wear resistant and lubricating magnetic head/slider construction; (3) a wear resistant and lubricating magnetic data storage disk; and (4) a method for fabricating the wear resistant and lubricating magnetic data storage disk. To fabricate the wear resistant and lubricating magnetic head/slider construction through the method of the present invention, there is first provided a slider substrate. There is then fabricated from the slider substrate a magnetic head/slider construction, where the magnetic head/slider construction has an air bearing surface of the magnetic head/slider construction. There is then formed over the air bearing surface of the magnetic head/slider construction a wear resistant carbon layer. There is then formed upon the wear resistant carbon layer a lubricating carbon layer. The method for forming the wear resistant and lubricating magnetic head/slider construction of the present invention also contemplates the wear resistant and lubricating magnetic head/slider formed through the method. Analogously, the wear resistant and lubricating magnetic head/slider construction of the present invention and the method for forming the wear resistant and lubricating magnetic head/slider construction of the present invention also contemplate an analogous method for forming a wear resistant and lubricating magnetic data storage disk and the wear resistant and lubricating magnetic data storage disk formed through the analogous method.

Through the present invention there is provided: (1) a wear resistant and lubricating magnetic head/slider construction; (2) a method for fabricating the wear resistant and lubricating magnetic head/slider construction; (3) a wear resistant and lubricating magnetic data storage disk; and (4) a method for fabricating the wear resistant and lubricating magnetic data storage disk. Through the methods of the present invention, there is formed over the air bearing surface (ABS) of either a magnetic head/slider construction or a magnetic data storage disk a wear resistant carbon layer, and there is subsequently formed upon the wear resistant carbon layer a lubricating carbon layer. Since through the methods of the present invention there is formed both a wear resistant carbon layer and a lubricating carbon layer over the air bearing surface (ABS) of either a magnetic head/slider construction or a magnetic data storage disk, where the wear resistant carbon layer more closely adjoins the magnetic head/slider construction or the magnetic data storage disk, there is formed through the methods of the present invention either a wear resistant and lubricating magnetic head/slider construction or a wear resistant and lubricating magnetic data storage disk.

The methods of the present invention, and: (1) the wear resistant and lubricating magnetic head/slider construction; and (2) the wear resistant and lubricating magnetic data storage disk formed through the methods of the present invention, are efficiently fabricated and readily manufacturable. As will be disclosed within the Description of the Preferred Embodiments, wear resistant carbon layers and lubricating carbon layers employed within the present invention may be readily sequentially formed in-situ over either (1) the air bearing surface (ABS) of a magnetic head/slider construction; or (2) the air bearing surface (ABS) of a magnetic data storage disk. Thus, the wear resistant and lubricating magnetic head/slider construction and the wear resistant and lubricating magnetic data storage disk of the present invention may be efficiently fabricated and readily manufactured through the methods of the present invention.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides: (1) a wear resistant and lubricating magnetic head/slider construction; (2) a method for fabricating the wear resistant and lubricating magnetic head/slider construction; (3) a wear resistant and lubricating magnetic data storage disk; and (4) a method for fabricating the wear resistant and lubricating magnetic data storage disk. The present invention provides the foregoing methods, magnetic head/slider construction and magnetic data storage disk through forming over the air bearing surface of either a magnetic head/slider construction or a magnetic data storage disk a wear resistant carbon layer having formed thereupon a lubricating carbon layer.

The present invention may be employed in forming wear resistant and lubricating magnetic head/slider constructions having fabricated therein various types of magnetic heads. The present invention may be employed in forming wear resistant and lubricating magnetic head/slider constructions having fabricated therein magnetic heads including but not limited to inductive magnetic read heads, inductive magnetic write heads, inductive magnetic read-write heads, magnetoresistive read heads and magnetoresistive read-inductive magnetic write heads. Similarly, the present invention may also be employed in forming wear resistant and lubricating magnetic data storage disks of various types. The present invention may be employed in forming wear resistant and lubricating magnetic data storage disks of types including but not limited to wear resistant and lubricating magnetic particle dispersion media magnetic data storage disks, wear resistant and lubricating plated thin film magnetic media magnetic data storage disks and wear resistant and lubricating sputtered thin film magnetic media magnetic data storage disks.

Finally, although the preferred embodiments of the present invention illustrate a wear resistant and lubricating magnetic head/slider construction formed in accord with a second preferred embodiment of the present invention and a wear resistant and lubricating magnetic data storage disk formed in accord with a first preferred embodiment of the present invention both fabricated into a direct access storage device (DASD) magnetic data storage enclosure, wear resistant and lubricating magnetic data storage disks formed in accord with the present invention, and in particular wear resistant and lubricating magnetic head/slider constructions formed in accord with the present invention may also be employed within magnetic data storage enclosures other than direct access storage device (DASD) magnetic data storage enclosures. Such other magnetic data storage enclosures include but are not limited to flexible magnetic disk magnetic data storage enclosures and linear access magnetic data storage enclosures.

First Preferred Embodiment

Figure 1:
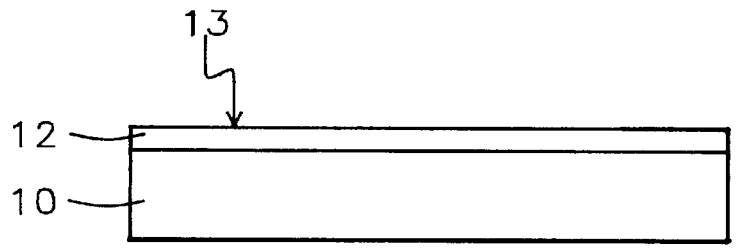
FIG. 1 to FIG. 3 show a series of schematic cross-sectional diagrams illustrating the results of progressive stages in forming a wear resistant and lubricating magnetic data storage disk in accord with a first preferred embodiment of the present invention.
Figure 2:
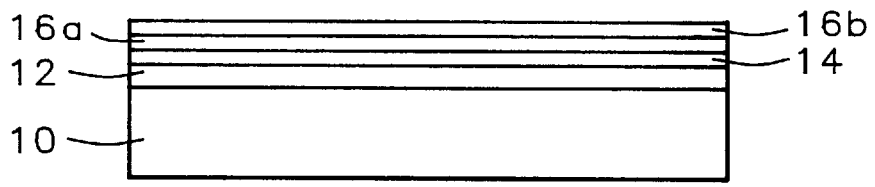
Figure 3:
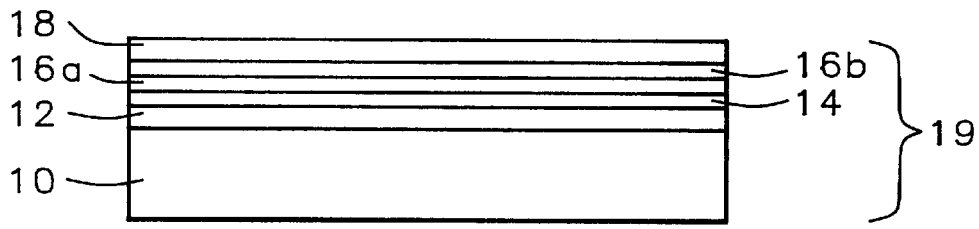

Referring now to FIG. 1 to FIG. 3; there is shown a series of schematic cross-sectional diagrams illustrating the results of progressive stages of fabricating in accord with a first preferred embodiment of the present invention a wear resistant and lubricating magnetic data storage disk. Shown in FIG. 1 is a schematic cross-sectional diagram of the wear resistant and lubricating magnetic data storage disk at an early stage in its fabrication.

Shown in FIG. 1 is a magnetic data storage disk substrate 10 having formed thereupon a magnetic storage layer 12, where the magnetic storage layer 12 has an air bearing surface 13 of the magnetic storage layer 12. Although magnetic data storage disk substrates may be formed from any of several non-magnetic materials as are known in the art of magnetic data storage disk fabrication, including but not limited to non-magnetic metallic materials and non-magnetic ceramic materials, for the wear resistant and lubricating magnetic data storage disk in accord with the first preferred embodiment of the present invention, the magnetic data storage disk substrate 10 is preferably formed of an aluminum alloy non-magnetic material, as is commonly employed in forming magnetic data storage disk substrates. Preferably, the magnetic data storage disk substrate 10 so formed is from about 0.25 to about 2.5 millimeters thick, where the thickness typically varies directly as a function of the diameter of the magnetic data storage disk substrate 10.

Similarly, Although it is also known in the art of magnetic data storage disk fabrication that magnetic storage layers may be formed upon magnetic data storage disk substrates from any of several magnetic storage materials, including but not limited to magnetic particle dispersion magnetic storage materials, plated thin film magnetic storage materials and sputtered thin film magnetic storage materials, for the first preferred embodiment of the present invention, the magnetic storage layer 12 is preferably formed of a thin film magnetic storage material deposited through a plating deposition method for a sputtering deposition method, as is similarly common in the art. Such thin film magnetic storage materials typically include but are not limited to alloys of cobalt and/or chromium, often but not exclusively formed upon chromium underlayers. Preferably the magnetic storage layer 12 is from about 100 to about 500 angstroms thick.

Referring now to FIG. 2, there is shown a schematic cross-sectional diagram illustrating the results of further processing of the magnetic data storage disk substrate 10 whose schematic cross-sectional diagram is illustrated in FIG. 1. Shown in FIG. 2 is a schematic cross-sectional diagram of the magnetic data storage disk substrate 10 as illustrated within FIG. 1, but upon the air bearing surface 13 of the magnetic storage layer 12 there is formed: (1) an adhesion promoter layer 14 having formed thereupon; (2) a wear resistant carbon layer 16a in turn having formed thereupon; (3) a lubricating carbon layer 16b. Within the wear resistant and lubricating magnetic data storage disk of the first preferred embodiment of the present invention, the adhesion promoter layer 14 is optional and typically excluded. Its composition is typically determined in accord with the composition of the magnetic storage material employed in forming the magnetic storage layer 12. Typically and preferably, the adhesion promoter layer 14, if present, is formed of a silicon material. More preferably, the adhesion promoter layer 14 is formed through a physical vapor deposition (PVD) sputtering method, although other deposition methods, such as but not limited to chemical vapor deposition (CVD) methods and plasma enhanced chemical vapor deposition (PECVD) methods may also be employed in forming the adhesion promoter layer 14. Preferably, the adhesion promoter layer 14 so formed is formed to a thickness of from about 10 to about 50 angstroms.

Although the use within magnetic head/slider constructions and magnetic data storage disks of various types of carbon layers characterized through various physical means has been generally disclosed within the Description of the Related Art, within the preferred embodiment of the wear resistant and lubricating magnetic data storage disk in accord with the first preferred embodiment of the present invention both the wear resistant carbon layer 16a and the lubricating carbon layer 16b are characterized principally by the elemental content of the wear resistant carbon layer 16a and the lubricating carbon layer 16b, in conjunction with the vacuum deposition method through which the wear resistant carbon layer 16a and the lubricating carbon layer 16b are formed. The elemental content is typically and preferably determined through Rutherford backscattering spectroscopic analysis or other suitable means. Although any of several vacuum deposition methods are known in the art through which carbon layers may be formed over or upon magnetic storage layers within magnetic data storage disks, including but not limited to thermally assisted evaporation methods, electron beam assisted evaporation methods, chemical vapor deposition (CVD) methods, plasma enhanced chemical vapor deposition (PECVD) methods and physical vapor deposition (PVD) sputtering methods, for the wear resistant and lubricating magnetic data storage disk in accord with the first preferred embodiment of the present invention both the wear resistant carbon layer 16a and the lubricating carbon layer 16b are preferably formed through a physical vapor deposition (PVD) sputtering method employing a graphite target source. Other methods and materials may, however, be employed in forming through the present invention wear resistant carbon layers such as the wear resistant carbon layer 16a and lubricating carbon layers such as the lubricating carbon layer 16b.

Within the wear resistant and lubricating magnetic data storage disk in accord with the first preferred embodiment of the present invention, it has been determined in part experimentally that the wear resistant carbon layer 16a is preferably formed from a wear resistant carbon material selected from the group of wear resistant carbon materials including but not limited to nitrogenated wear resistant carbon materials having a nitrogen content of from about 15 to about 30 atomic percent and hydrogenated wear resistant carbon layers having a hydrogen content of from about 15 to about 25 atomic percent. Preferably, the wear resistant carbon layer 16a is formed to a thickness of from about 40 to about 200 angstroms. Similarly, the lubricating carbon layer 16b employed within the wear resistant and lubricating magnetic data storage disk in accord with the first preferred embodiment of the present invention is preferably formed of a hydrogenated lubricating carbon material having a hydrogen content of from about 30 to about 40 atomic percent. Preferably, the lubricating carbon layer 16b is formed to a thickness of from about 20 to about 50 angstroms. As a secondary means for characterizing the wear resistant carbon layer 16a and the lubricating carbon layer 16b formed in accord with the first preferred embodiment of the present invention, the wear resistant carbon layer 16a when formed of a hydrogenated wear resistant carbon material typically has a sessile water drop contact angle of from about 50 to about 65 degrees, while the lubricating carbon layer 16b when formed of a hydrogenated lubricating carbon material typically has a sessile water drop contact angle of from about 80 to about 85 degrees. While other means may also exist for characterizing the wear resistant carbon layer 16a and the lubricating carbon layer 16b in accord with the first preferred embodiment of the present invention, such as but not limited to crystallographic analyses and other absorption spectroscopic analysis, certain of these other means may present experimental difficulties in characterizing the wear resistant carbon layer 16a and/or the lubricating carbon layer 16b.

When forming in accord with the first preferred embodiment of the present invention the wear resistant carbon layer 16a from a nitrogenated wear resistant carbon material, the physical vapor deposition (PVD) sputtering method employed within first preferred embodiment of the present invention preferably employs: (1) a reactor chamber pressure of from about 1.0 to about 6.0 mtorr; (2) a magnetic data storage disk substrate temperature of from about 25 to about 150 degrees centigrade; (3) an argon flow rate of from about 25 to about 60 standard cubic centimeters per minute (sccm); (4) a nitrogen flow rate of from about 2.5 to about 6.0 standard cubic centimeters per minute (sccm); (5) a sputtering bias voltage of from about −400 to about −800 volts; and (6) a sputtering bias current of from about 1.0 to about 2.0 amps.

Similarly, when forming in accord with the first preferred embodiment of the present invention the wear resistant carbon layer 16a from a hydrogenated wear resistant carbon material, the physical vapor deposition (PVD) sputtering method employed within the first preferred embodiment of the present invention preferably employs: (1) a reactor chamber pressure of from about 1.0 to about 6.0 mtorr; (2) a magnetic data storage disk substrate temperature of from about 25 to about 150 degrees centigrade; (3) an argon flow rate of from about 25 to about 60 standard cubic centimeters per minute (sccm); (4) a hydrogen flow rate of from about 2.5 to about 10 standard cubic centimeters per minute (sccm); (5) a sputtering bias voltage of from about −400 to about −800 volts and (6) a sputtering bias current of from about 1.0 to about 2.0 amps.

Finally, when forming in accord with the first preferred embodiment of the present invention the lubricating carbon layer 16b from a hydrogenated lubricating carbon material, the physical vapor deposition (PVD) sputtering method employed within the first preferred embodiment of the present invention preferably employs: (1) a reactor chamber pressure of from about 5 to about 10 mtorr; (2) a magnetic data storage disk substrate temperature of from about 25 to about 150 degrees centigrade; (3) an argon flow rate of from about 25 to about 60 standard cubic centimeters per minute (sccm); (4) a hydrogen flow rate of from about 5.0 to about 12 standard cuubic centimeters per minute (sccm); (5) a sputtering bias voltage of from about −200 to about −400 volts; and (6) a sputtering bias current of from about 0.5 to about 1.0 amp.

Although not specifically illustrated by the schematic cross-sectional diagram of FIG. 2, within the preferred embodiment of the wear resistant and lubricating magnetic data storage disk in accord with the first preferred embodiment of the present invention the adhesion promoter layer 14 (if present), the wear resistant carbon layer 16a and the lubricating carbon layer 16b are each preferably formed sequentially in-situ over the magnetic data storage disk substrate 10 within the same reactor chamber, thus providing manufacturing efficiency and economy in forming the wear resistant and lubricating magnetic data storage disk in accord with the first preferred embodiment of the present invention.

Referring now to FIG. 3, there is shown a schematic cross sectional diagram illustrating the results of further processing of the magnetic data storage disk substrate 10 whose schematic cross-sectional diagram is illustrated in FIG. 2. Shown in FIG. 3 is a schematic cross-sectional diagram of the magnetic data storage disk substrate 10 otherwise equivalent to the magnetic data storage disk substrate 10 whose schematic cross-sectional diagram is illustrated in FIG. 2, but upon whose surface is formed a fluorochemical lubricant layer 18. Methods and materials through which fluorochemical lubricant layers may be formed upon or over magnetic data storage disk surfaces are known in the art of magnetic data storage disk fabrication. Fluorochemical lubricant layers are typically formed upon or over magnetic data storage disks through methods including but not limited to spin coating methods, immersion coating methods and burnishing methods through which are formed fluorochemical lubricant layers of fluorochemical lubricant materials typically but not exclusively formed of perfluoropolyether fluorochemical lubricant materials. Perfluoropolyether fluorochemical lubricant materials are generally known in the art to be provided as proprietary perfluoropolyether fluorochemical lubricant formulations available under the tradenames such as but not limited to Fomblin Z-25, AM-2001 and Z-Dol. For the wear resistant and lubricating magnetic data storage disk in accord with the first preferred embodiment of the present invention, the fluorochemical lubricant layer 18 may be formed from any of the foregoing fluorochemical lubricant materials, preferably through a spin coating and burnishing method to form a fluorochemical lubricant layer 18 of thickness about 10 to about 30 angstroms upon the lubricant carbon layer 16b.

Upon forming the fluorochemical lubricant layer 18 upon the lubricant carbon layer 16b as illustrated in FIG. 3, there is formed a wear resistant and lubricating magnetic data storage disk 19 in accord with the first preferred embodiment of the present invention. The wear resistant and lubricating magnetic data storage disk 19 so formed simultaneously possesses superior wear resistance characteristics and superior lubricating properties in comparison with magnetic data storage disks conventional in the art, which conventional magnetic data storage disks have formed thereupon carbon coatings which possess only either wear resistance characteristics or lubricating properties.

Second Preferred Embodiment

Figure 4:
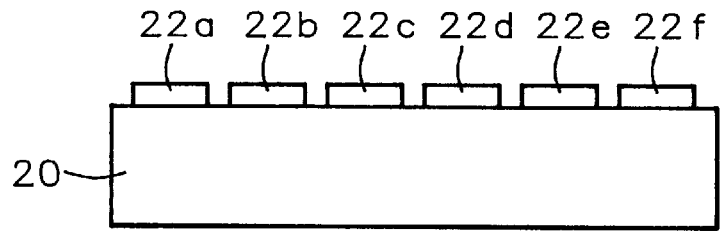
FIG. 4 to FIG. 6 show a series of schematic cross-sectional diagrams illustrating the results of progressive stages in forming a wear resistant and lubricating magnetic head/slider construction in accord with a second preferred embodiment of the present invention.
Figure 5:
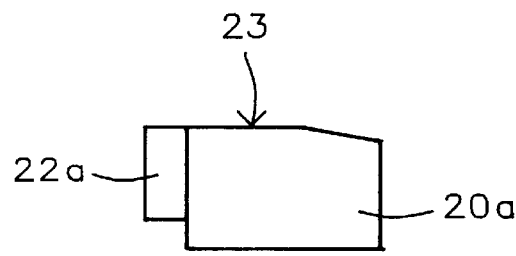
Figure 6:
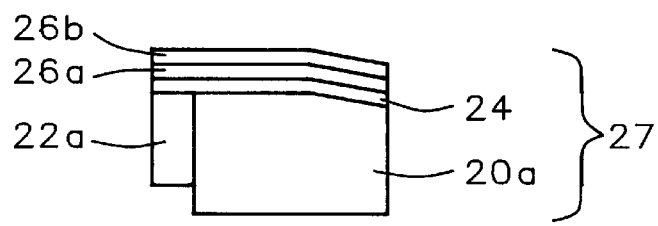

Referring now to FIG. 4 to FIG. 6, there is shown a series of schematic cross-sectional diagrams illustrating the results of progressive stages in fabricating a wear resistant and lubricating magnetic head/slider construction in accord with a second preferred embodiment of the present invention. Shown in FIG. 4 is a schematic cross-sectional diagram of the wear resistant and lubricating magnetic head/slider construction at an early stage in its fabrication.

Shown in FIG. 4 is a slider substrate 20 having formed thereupon a series of magnetic heads 22a, 22b, 22c, 22d, 22e and 22f. Methods and materials through which slider substrates may be formed and through which magnetic heads may subsequently be formed upon those slider substrates are conventional to the art of magnetic head/slider construction fabrication. Slider substrates employed within magnetic head/slider construction fabrication are typically formed of non-magnetic ceramic substrate materials including but not limited to oxides, nitrides, carbides and borides, where the non-magnetic ceramic substrate materials are formed of compositions providing appropriate physical characteristics to allow ready fabrication of magnetic head/slider constructions from those slider substrates. For the second preferred embodiment of the present invention, the slider substrate 20 is preferably formed of an aluminum oxide-titanium carbide non-magnetic ceramic material, although any of several other non-magnetic ceramic materials may also be employed in forming the slider substrate 20. Preferably, the slider substrate 20 so formed is from about 2 to about 3 millimeters thick.

Although not specifically illustrated in FIG. 4, the magnetic heads 22a, 22b, 22c, 22d, 22e, and 22f as illustrated in FIG. 4 may encompass any of several types of magnetic heads as are known in the art of magnetic data recording and retrieval, including but not limited to digital magnetic data recording and retrieval. Such magnetic heads may include, but are not limited to inductive magnetic read heads, inductive magnetic write heads, inductive magnetic read-write heads, magnetoresistive read heads and magnetoresistive read-inductive write heads. Similarly, although the magnetic heads 22a, 22b, 22c, 22d, 22e and 22f are illustrated within FIG. 4 as single layers, as is understood by a person skilled in the art the magnetic heads 22a, 22b, 22c, 22d, 22e and 22f, regardless of the specific type of magnetic head, will typically be formed of several inter-related layers, including but not limited to inductive magnetic pole layers, magnetoresistive layers, antiferromagnetic layers, magnetic gap filling layers, insulator layers, interconnection layers and passivation layers, as appropriate to the type of magnetic head desired to be formed. For the wear resistant and lubricating magnetic head/slider construction in accord with the second preferred embodiment of the present invention, the magnetic heads 22a, 22b, 22c, 22d, 22e and 22f are preferably magnetoresistive read-inductive write magnetic heads formed employing assorted types and thicknesses of layers as are conventionally employed in the art of fabricating magnetoresistive read-inductive write heads upon slider substrates.

Referring now to FIG. 5, there is shown a schematic cross-sectional diagram illustrating the results of further processing of the slider substrate 20 whose schematic cross-sectional diagram is illustrated in FIG. 4. Shown in FIG. 5 is a slider 20a which is parted and machined from the slider substrate 20, the slider 20a having formed thereupon the magnetic head 22a, thus forming a magnetic head/slider construction. The slider 20a is parted and machined from the slider substrate 20 through parting and machining methods as are conventional in the art of magnetic head/slider construction fabrication. As is illustrated in FIG. 5, the magnetic head/slider construction is typically and preferably lapped to form an air bearing surface 23 where at least a portion of the slider 20a is co-planar with the magnetic head 22a. As is also illustrated in FIG. 5, it is also common for the leading edge (ie: the edge opposite the magnetic head) of the air bearing surface 23 of the magnetic head/slider construction to have a taper to facilitate proper aerodynamic lifting of the magnetic head/slider construction when employed within a direct access storage device (DASD) magnetic data storage enclosure. Although not specifically illustrated in FIG. 5, it is also common in the art of magnetic head/slider construction fabrication for the air bearing surface of a slider, such as the slider 20a, to be machined in a fashion such that rails are formed within the air bearing surface, such as the air bearing surface 23, of the slider, such as the slider 20a. Such rails also facilitate proper aerodynamic lifting of the magnetic head/slider construction when employed within the direct access storage device (DASD) magnetic data storage enclosure. Representative patterns of rails are shown, for example and without limitation, by Grill et al. in U.S. Pat. No. 5,159,508 (see FIG. 2, FIG. 3 and accompanying text). Within the wear resistant and lubricating magnetic head/slider construction in accord with the second preferred embodiment of the present invention, the slider substrate 20 is preferably parted and machined to form the slider 20a as illustrated in FIG. 2 typically having a thickness of about 0.4 to about 0.5 millimeters and an air bearing surface 23 of length about 2.00 to about 2.10 millimeters and width about 1.57 to about 1.63 millimeters, for a typical mono-head slider. Within the wear resistant and lubricating magnetic head/slider construction in accord with the second preferred embodiment of the present invention, the dimensions of the magnetic head 22a typically compare negligibly with the dimensions of the slider 20a.

Referring now to FIG. 6, there is shown a schematic cross-sectional diagram illustrating the results of further processing of the magnetic head/slider construction whose schematic cross-sectional diagram is illustrated in FIG. 5. Shown in FIG. 6 is a schematic cross-sectional diagram of the magnetic head/slider construction otherwise equivalent to the magnetic head/slider construction whose schematic cross-sectional diagram is illustrated in FIG. 5, but upon whose air bearing surface 23 is formed: (1) an adhesion promoter layer 24 having formed thereupon; (2) a wear resistant carbon layer 26a in turn having formed thereupon; (3) a lubricating carbon layer 26b, thus forming from the magnetic head/slider construction as illustrated in FIG. 5 a wear resistant and lubricating magnetic head/slider construction 27. Within the wear resistant and lubricating magnetic head/slider construction 27 in accord with the second preferred embodiment of the present invention, the adhesion promoter layer 24 is preferably formed through methods, materials and dimensions equivalent to the methods, materials and dimensions employed in forming the adhesion promoter layer 14 within the wear resistant and lubricating magnetic data storage disk 19 in accord with the first preferred embodiment of the present invention. Similarly, within the wear resistant and lubricating magnetic head/slider construction 27 in accord with the second preferred embodiment of the present invention, the wear resistant carbon layer 26a is preferably formed through methods, materials and dimensions equivalent to the methods, materials and dimensions employed in forming the wear resistant carbon layer 16a with the wear resistant and lubricating magnetic data storage disk 19 in accord with the first preferred embodiment of the present invention. Finally, within the wear resistant and lubricating magnetic head/slider construction 27 in accord with the second preferred embodiment of the present invention, the lubricating carbon layer 26b is preferably formed through methods, materials and dimensions equivalent to the methods, materials and dimensions employed in forming the lubricating carbon layer 16b within the wear resistant and lubricating magnetic data storage disk 19 in accord with the first preferred embodiment of the present invention.

Thus, upon sequentially forming an optional adhesion promoter layer 24, the wear resistant carbon layer 26a and the lubricating carbon layer 26b upon the magnetic head/slider construction whose schematic cross-sectional diagram is illustrated in FIG. 6, there is formed through the second preferred embodiment of the present invention the wear resistant and lubricating magnetic head/slider construction 27 analogous with the wear resistant and lubricating magnetic data storage disk 19 formed in accord with the first preferred embodiment of the present invention. Similarly with the wear resistant and lubricating magnetic data storage disk 19 whose schematic cross-sectional diagram is illustrated in FIG. 3, the optional adhesion promoter layer 24, the wear resistant carbon layer 26a and the lubricating carbon layer 26b within the wear resistant and lubricating magnetic head/slider construction 27 whose schematic cross-sectional diagram is illustrated in FIG. 6 may also advantageously be formed sequentially in-situ within the same reactor chamber in order to provide for improved manufacturing efficiency and economy in forming the wear resistant and lubricating magnetic head/slider construction 27 in accord with the second preferred embodiment of the present invention.

Figure 7:
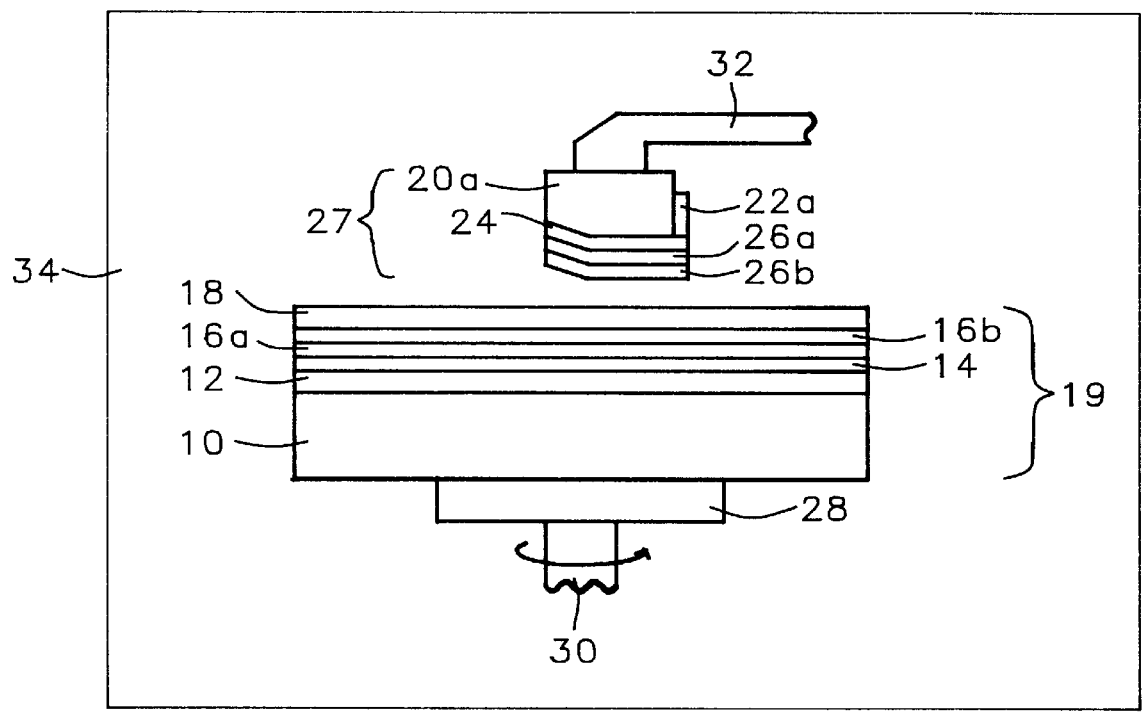
FIG. 7 illustrates a schematic cross-sectional diagram of a direct access storage device (DASD) magnetic data storage enclosure having fabricated therein the wear resistant and lubricating magnetic head/slider construction in accord with the second preferred embodiment of the present invention and the wear resistant and lubricating magnetic data storage disk in accord with the first preferred embodiment of the present invention.

Referring now to FIG. 7, there is shown a schematic cross-sectional diagram illustrating a direct access storage device (DASD) magnetic data storage enclosure having fabricated therein the wear resistant and lubricating magnetic data storage disk 19 of the first preferred embodiment of the present invention whose schematic cross-sectional diagram is illustrated in FIG. 3 and the wear resistant and lubricating magnetic head/slider construction 27 of the second preferred embodiment of the present invention whose schematic cross-sectional diagram is illustrated in FIG. 6.

Shown in FIG. 7 is the wear resistant and lubricating magnetic data storage disk 19 in accord with the first preferred embodiment of the present invention fixed upon a hub 28 within a direct access storage device (DASD) magnetic data storage enclosure 34. The hub 28 is rotated by a spindle 30 attached thereto, thus providing a relative rotation of the wear resistant and lubricating magnetic data storage disk 19 with respect to the wear resistant and lubricating magnetic head/slider construction 27 in accord with the second preferred embodiment of the present invention which is similarly fixed upon a magnetic head/slider construction suspension 32 within the direct access storage device (DASD) magnetic data storage enclosure 34.

Although there is shown within FIG. 7 the direct access storage device (DASD) magnetic data storage enclosure 34 having fabricated therein both the wear resistant and lubricating magnetic data storage disk 19 in accord with the first preferred embodiment of the present invention and the wear resistant and lubricating magnetic head/slider construction 27 in accord with the second preferred embodiment of the present invention, there may also be provided through the present invention an advantage in fabricating a direct access storage device (DASD) magnetic data storage enclosure with either one but not both of the wear resistant and lubricating magnetic data storage disk 19 in accord with the first preferred embodiment of the present invention and the wear resistant and lubricating magnetic head/slider construction 27 in accord with the second preferred embodiment of the present invention fabricated therein.

As is understood by a person skilled in the art, the preferred embodiments of the methods of the present invention and the wear resistant and lubricating magnetic data storage disk 19 and wear resistant and lubricating magnetic head/slider construction 27 fabricated through the preferred embodiments of the methods of the present invention are illustrative of the present invention rather than limiting of the present invention. Revisions and modifications may be made to methods, materials, structures and dimensions through which is provided the wear resistant and lubricating magnetic data storage disk 19 in accord with the first preferred embodiment of the present invention and the wear resistant and lubricating magnetic head/slider construction 27 in accord with the second preferred embodiment of the present invention while still providing a wear resistant and lubricating magnetic data storage disk or a wear resistant and lubricating magnetic head/slider construction in accord with the present invention, as defined by the accompanying claims.

What is claimed is:

1. A method for fabricating a magnetic head/slider comprising:

providing a slider substrate;

forming from the slider substrate a magnetic head/slider, the magnetic head/slider having an air bearing surface (ABS) of the magnetic head/slider;

forming over the air bearing surface (ABS) of the magnetic head/slider a wear resistant carbon layer, the wear resistant carbon layer being formed from a wear resistant carbon material selected from the group consisting of:
      nitrogenated carbon materials having a nitrogen content of from about 15 to about 30 atom percent; and
      hydrogenated carbon materials having a hydrogen content of from about 15 to about 25 atom percent; and forming upon the wear resistant carbon layer a lubricating carbon layer, where the wear resistant carbon layer has a different elemental content than the lubricating carbon layer.

2. The method of claim 1 wherein the wear resistant carbon layer and the lubricating carbon layer are each formed through a physical vapor deposition (PVD) sputtering method employing a graphite target.

3. The method of claim 2 wherein:

the wear resistant carbon layer is formed to a thickness of from about 40 to about 200 angstroms.

4. The method of claim 2 wherein:

the lubricating carbon layer is formed to a thickness of from about 20 to about 50 angstroms; and the lubricating carbon layer is formed form a hydrogenated lubricating carbon material having a hydrogen content of from about 30 to about 40 atom percent.

5. The method of claim 2 wherein the lubricating carbon layer is formed in-situ upon the wear resistant carbon layer.

6. The method of claim 1 further comprising forming an adhesion layer over the air bearing surface (ABS) of the magnetic head/slider prior to forming the wear resistant carbon layer over the air bearing surface (ABS) of the magnetic head/slider, wherein:

the wear resistant carbon layer is formed in-situ upon the adhesion layer; and the adhesion layer is formed from a silicon adhesion material formed to a thickness of from about 10 to about 50 angstroms.

7. A method for fabricating a magnetic data storage disk comprising:

providing a magnetic data storage disk substrate;

forming upon the magnetic data storage disk substrate a magnetic storage layer, the magnetic storage layer having an air bearing surface (ABS);

forming over the air bearing surface (ABS) of the magnetic recording layer a wear resistant carbon layer, the wear resistant carbon layer being formed from a wear resistant carbon material selected from the group consisting of:
      nitrogenated carbon materials having a nitrogen content of from about 15 to about 30 atom percent; and
      hydrogenated carbon materials having a hydrogen content of from about 15 to about 25 atom percent; and forming upon the wear resistant carbon layer a lubricating carbon layer, where the wear resistant carbon layer has a different elemental content than the lubricating carbon layer.

8. The method of claim 7 wherein the wear resistant carbon layer and the lubricating carbon layer are each formed through a physical vapor deposition(PVD) sputtering method employing a graphite target.

9. The method of claim 8 wherein:

the wear resistant carbon layer has a thickness of from about 40 to about 200 angstroms.

10. The method of claim 8 wherein:

the lubricating carbon layer is formed to a thickness of from about 20 to about 50 angstroms; and the lubricating carbon layer is formed from a hydrogenated lubricating carbon material having a hydrogen content of from about 30 to about 40 atom percent.

11. The method of claim 8 wherein the lubricating carbon layer is formed in-situ upon the wear resistant carbon layer.

12. The method of claim 7 further comprising forming an adhesion layer over the air bearing surface (ABS) of the magnetic storage layer prior to forming the wear resistant carbon layer over the air bearing surface (ABS) of the magnetic storage layer, wherein:

the wear resistant carbon layer is formed in-situ upon the adhesion layer; and the adhesion layer is formed from a silicon adhesion material formed to a thickness of from about 10 to about 50 angstroms.

* * * * *